United States Patent [19]

Sato et al.

[11] Patent Number: 4,734,476
[45] Date of Patent: Mar. 29, 1988

[54] PHOTO-SETTING RESIN COMPOSITION

[75] Inventors: Hideo Sato; Hiroshi Kawabata, both of Yokohamashi, Japan

[73] Assignee: Chisso Corporation, Osaka, Japan

[21] Appl. No.: 868,067

[22] Filed: May 29, 1986

[30] Foreign Application Priority Data

Jun. 18, 1985 [JP] Japan .................................. 60-132818
Feb. 17, 1986 [JP] Japan .................................. 61-32251

[51] Int. Cl.$^4$ .................... C08F 120/58; C08F 120/60; C08F 220/58; C08F 220/60
[52] U.S. Cl. ..................................... 526/304; 526/307; 526/310; 526/318; 526/321; 526/323
[58] Field of Search ............... 526/304, 310, 307, 318, 526/323, 321

[56] References Cited

U.S. PATENT DOCUMENTS

| 2,254,382 | 9/1941 | Neher .................................. 526/304 |
| 2,699,437 | 1/1955 | D'Alelio .............................. 526/304 |
| 3,725,231 | 4/1973 | Jahnkee ............................... 526/304 |
| 3,882,004 | 5/1975 | Mori ...................................... 522/65 |
| 3,950,392 | 4/1976 | D'Alelio .............................. 526/304 |
| 3,953,544 | 4/1976 | Jones et al. ......................... 526/304 |

FOREIGN PATENT DOCUMENTS 57-14673 1/1982 Japan ................................... 526/304

OTHER PUBLICATIONS

Chem Abstracts, vol. 94, entry 112544c.
Chem. Abstracts, vol. 82, entry 171669x.
Chem. Abstracts, vol. 105, entry 105753n.

Primary Examiner—Edward J. Smith
Assistant Examiner—Peter F. Kulkosky
Attorney, Agent, or Firm—Fred Philpitt

[57] ABSTRACT

A photo-setting resin composition having a good storage stability; using no hexavalent chrome; having well-balanced photosenstive and dyeing properties; capable of being developed with an aqueous solvent; and having a superior resolution when a color filter is formed, is provided, which composition is obtained by copolymerizing as effective components, a monomer expressed by the formula

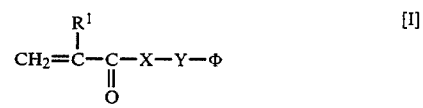

[I]

wherein $R^1$ represents H, $CH_3$ or $C_2H_5$; X represents —O— or —NH—; Y represents a linear chain or branched hydrocarbon group of 1 to 4 carbon atoms; Φ represents

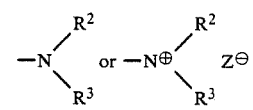

wherein $R^2$ and $R^3$ each represent an alkyl group of 1 to 4 carbon atoms and $Z^\ominus$ represents an anion, with a monomer expressed by the formula

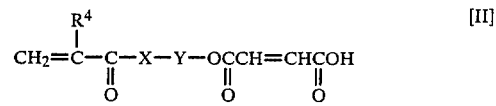

[II]

wherein $R^4$ represents H, $CH_3$ or $C_2H_5$ and X and Y each are as defined above.

4 Claims, 2 Drawing Figures

PHOTO-SETTING RESIN COMPOSITION

BACKGROUND OF THE INVENTION

1. Field of the Invention

This invention relates to a photo-setting resin composition. More particularly it relates to a photo-setting resin composition containing as indispensable components, an ethylenic unsaturated double bond which is addition-polymerizable by means of a photo-irradiation, and an amino group, a substituted amino group or a quaternary ammonium salt.

Since the photo-setting resin composition of the present invention has superior dyeing properties for acid dyes, the composition is not only particularly suitable as a color filter-forming material used for color video camera, liquid crystal color television (TV), etc., but also it can be used in the application fields of general photoresists such as processed parts in electronic fields, printing materials in printing industry, etc.

2. Description of the Prior Art

As color filter-forming materials, photosensitive compositions comprising a natural high molecular weight polymer such as gelatin, glue, etc. and a hexavalent chrome compound such as ammonium bichromate, potassium bichromate, etc. as a photo-crosslinking agent, have so far been used.

Color filters have generally been produced as follows: a photosensitive composition as described above is coated onto a substrate such as glass or a solid image sensor, according to spin coating process, followed by exposure to U.V. ray by the medium of a stripe or mosaic pattern and development to form a colorless, transparent pattern on the substrate, immersing this colorless, transparent pattern in a dye solution containing a dye, etc. to dye the pattern, forming a protecting film on the dyed pattern with a resin or the like and repeating the above steps to produce the objective color filter.

Gelatin, glue, etc. have good dyeing properties for acid dyes and a superior resolution, and yet an advantage in the aspect of process that development with water is possible without using any organic solvent. However, since gelatin, glue, etc. are natural high molecular weight substances, it is difficult to obtain those having a definite molecular weight distribution or a definite concentration of amino group necessary for dyeing with acid dyes. Further, the so-called dark reaction where a curing reaction similar to the photo-insolubilizing reaction occurs even before or after exposure is liable to occur; hence a long-term storage of the sensitizing solution thereof is impossible so that exposure and development must be carried out within a short time after the solution has been applied on the substrate. Further there is still another drawback that it is necessary to use hexavalent chrome compounds harmful to human body.

As attempts to overcome these drawbacks, for example, the following photosensitive resins have been known: a photosensitive resin comprising as a main component, a copolymer of 4'-methacroyloxychalcone with a tertiary amine having an unsaturated bond copolymerizable therewith (Japanese patent application laid-open No. Sho 59-48758/1984), a photosensitive resin composition comprising as main components, a terpolymer consisting of 2-hydroxyethyl methacrylate, 3-dimethylaminopropyl methacrylate and acrylamide and a diazo compound as a photo-crosslinking agent (Japanese patent application laid-open No. Sho 58-199342/1983), etc. However, in the former case, no hexavalent chrome is used and the dark reaction can be inhibited, but there are operational drawbacks in the aspect of labor-hygienic administration that development with an aqueous solvent is impossible and an organic solvent must be used for development.

Further, since chalcone compounds as described above are those of a photo-dimerized type, the proportion of chalcone group in the copolymer should be increased in order to obtain a required film strength; hence there is a drawback that it is difficult to achieve the balance between the photosensitive properties and the dyeing properties.

Further the latter case has drawbacks that it is not only incomplete to inhibit the dark reaction, but also a yellowish color change in resins after cured occurs.

SUMMARY OF THE INVENTION

The object of the present invention is to provide a photosensitive resin composition
(i) having the dark reaction inhibited and hence having a good storage stability,
(ii) using no harmful hexavalent chrome,
(iii) being easy to achieve the balance between the photosensitive properties and the dyeing properties, and
(iv) capable of being developed with an aqueous solvent without using an organic solvent,
which composition affords a cured resin
(v) having dyeing properties with acid dyes for the resin and
(vi) also having a resolution when a color filter is formed, the extents of the dyeing properties and the resolution being to the same as or higher than those in the case of cured resins obtained from conventional photosensitive compositions comprising gelatin or glue as main component.

In order to overcome the above-mentioned various drawbacks of conventional color filter-forming materials, the present inventors have made extensive research on various combinations of compounds having dyeability with those having photosensitivity, and as a result have found that when a photo-setting resin composition obtained by copolymerizing monomers [I] and [II] described below is used, it is possible to solve the above-mentioned problems.

The present invention resides in a photo-setting resin composition obtained by copolymerizing as effective components, a monomer expressed by the formula

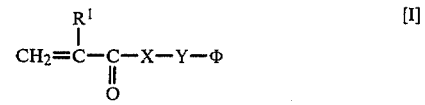

wherein $R^1$ represents H, $CH_3$ or $C_2H_5$; X represents —O— or —NH—; Y represents a linear chain or branched hydrocarbon group of 1 to 4 carbon atoms; Φ represents

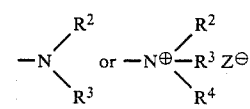

wherein $R^2$, $R^3$ and $R^4$ each represent an alkyl group of 1 to 4 carbon atoms and $Z^\ominus$ represents an anion, with a monomer expressed by the formula

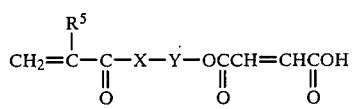  [II]

wherein $R^5$ represents H, $CH_3$ or $C_2H_5$ and X and Y each are as defined above.

DETAILED DESCRIPTION OF PREFERRED EMBODIMENTS

Figure 1:
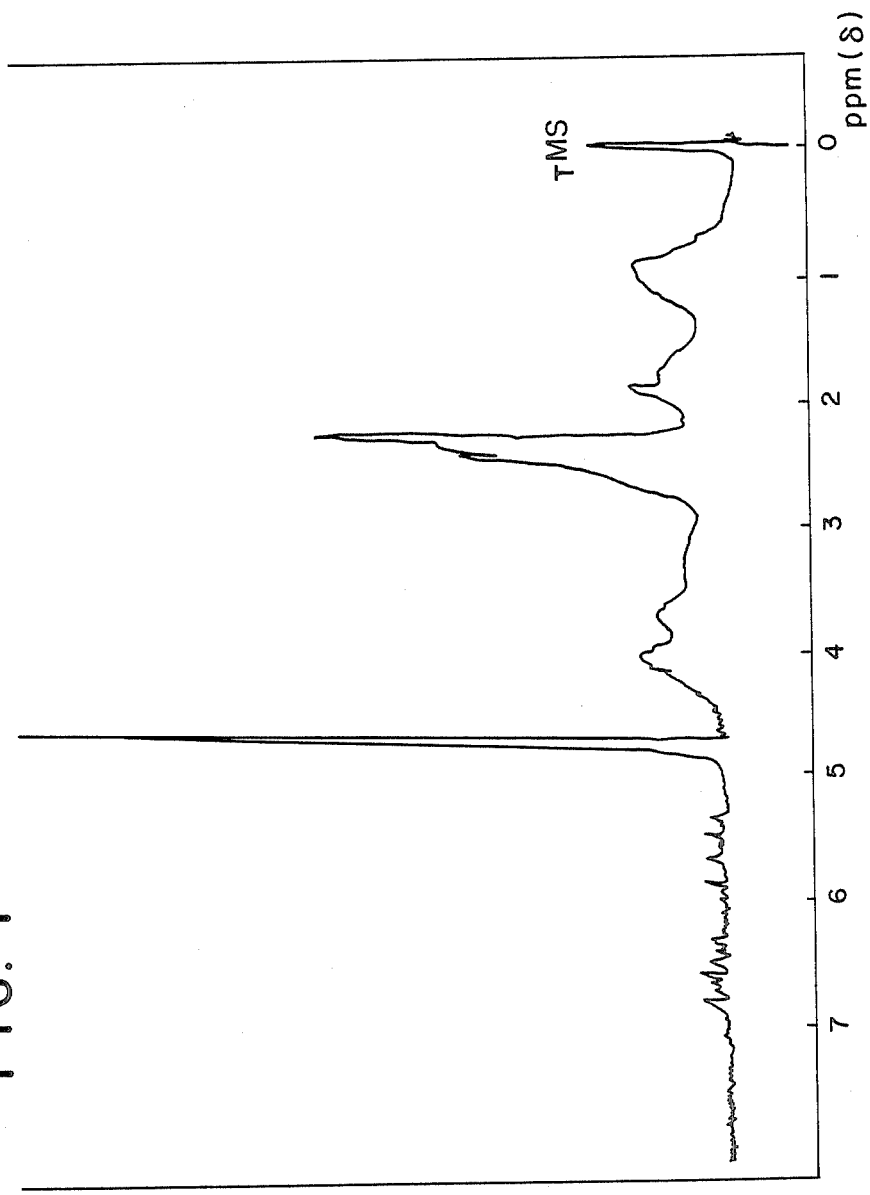
FIG. 1 shows a NMR chart of a photo-setting resin composition of the present invention (Example 1).

The monomer expressed by the above formula [I] plays a role of enhancing the function of dyeability and solubility in water.

The proportion of the monomer units of the formula [I] in the copolymer is preferred to be in the range of 20 to 80% by mol in view of the requirements based on the dyeability and the solubility in water.

Concrete examples of the monomer of the above formula [I] wherein Φ represents

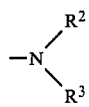

are as follows:

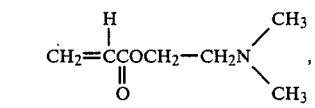

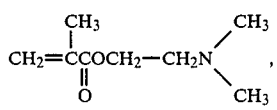

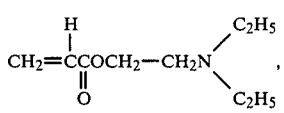

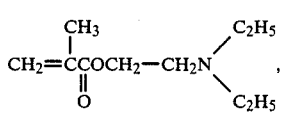

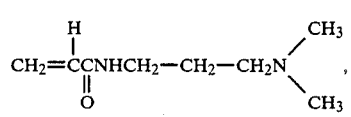

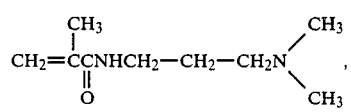

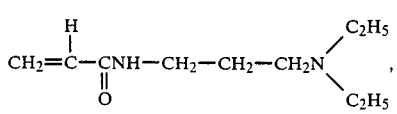

—continued

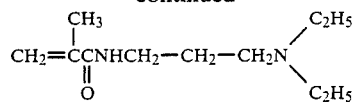

Further, concrete examples of the monomer of the formula [I] wherein Φ represents

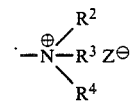

are as follows:

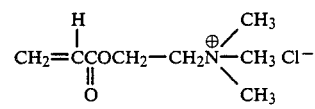

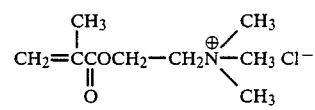

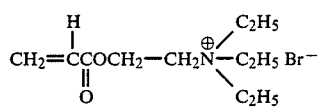

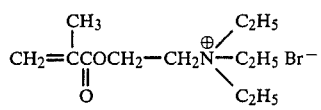

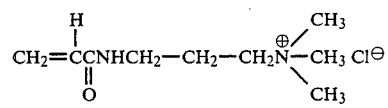

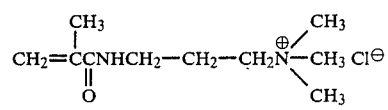

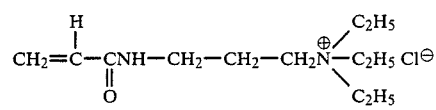

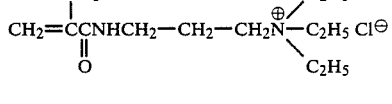

Concrete examples of monomers of the above formula [II] copolymerizable with the above-mentioned monomers are as follows:

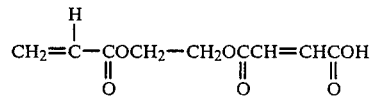

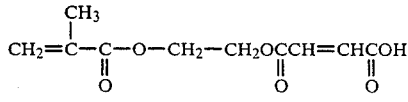

-continued

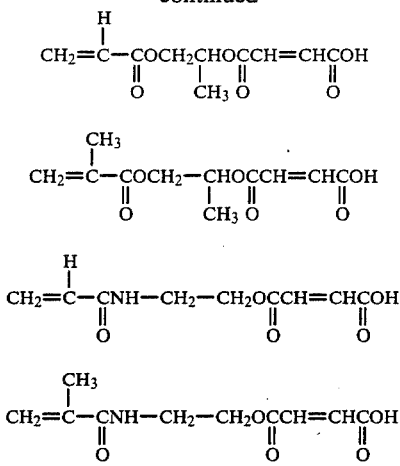

As to the part of the formula [II] in the copolymer, the ethylenic unsaturated double bond therein causes polymerization and crosslinking through photoirradiation to insolubilize the resulting copolymer in solvents and plays the role of retaining it on a color filter-forming substrate. In the photo-setting resin composition of the present invention, the proportion of the part of the formula [II] in the copolymer is suitable to be in the range of 5 to 80% by mol, preferably 10 to 70% by mol. If it is less than 5% by mol, the resolution lowers and the strength of the resulting coating is insufficient, while if it exceeds 80% by mol, the proportion of the structural unit having an amino group is reduced and the dyeing properties are inferior.

It is also possible, of course, to copolymerize these monomers with other monomers copolymerizable therewith such as acrylic acid, methacrylic acid, acrylic esters, methacrylic esters, in a quantity within a range in which the dyeing properties and the solubility in water are not damaged, that is, in a quantity less than 50% by weight, preferably 30% by weight or less based on the total weight of the total monomers to improve the adhesion of the resin onto the substrate.

The process for producing the photo-setting resin composition of the present invention i.e. the copolymerization process is not restricted, but usually the copolymer i.e. the composition is produced according to radical polymerization using a radical initiator. As to the polymerization manner, any of bulk polymerization, solution polymerization, suspension polymerization and emulsion polymerization may be employed, but for convenience of preparing a photosensitizing solution with the composition, solution polymerization is preferred.

The polymerization conditions are not restricted, but usually the reaction is carried out at 50° to 150° C., preferably 60° to 120° C., and for 30 minutes to 10 hours, preferably 1 to 6 hours.

After completion of the polymerization, it is preferred to separate the polymerization solvent and unreacted monomers in a non-solvent to the resulting copolymer, followed by drying to obtain the copolymer i.e. the photo-setting resin composition of the present invention.

The photo-setting resin composition of the present invention is usually dissolved in a solvent and if necessary, photosensitizer, photopolymerization initiator, etc. are added, and the resulting composition is applied in solution state to practical use.

As the photosensitizer, 5-nitroacenaphthene, Michler's ketone, anthraquinone, 2-methylanthraquinone, 4-nitronaphtylamine, etc. are preferred. As the photopolymerization initiator, benzoin alkyl ethers such as benzoin ethyl ether, 2,2-diethoxyacetophenone, benzophenone, benzyl dimethyl ketal, etc. are preferably used.

The photosensitizer is used in the range of 1 to 10% by weight, preferably 3 to 7% by weight based on the weight of the polymer. If the proportion of the photosensitizer exceeds 10% by weight, the strength of the resulting coating is low.

The photopolymerization initiator is suitable to be used in the range of 0.5 to 5% by weight, preferably 1 to 3% by weight based on the weight of the polymer. If the proportion of the initiator exceeds 5% by weight, the dark reaction occurs during the storage of the composition to reduce the stability of the photo-setting resin composition.

Further, if the proportions of the photosensitizer or the photopolymerization initiator added are less than the above values, there occur disadvantages in the aspect of properties such as extension of the irradiation period of time required for the photo-setting reaction, reduction in the resolution, etc.

The present invention is characterized in use of a monomer of the formula [II] having an ethylenic unsaturated double bond which is easily subjected to addition polymerization by photoirradiation.

Unlike photo-dimerization type unsaturated double bonds, addition polymerization type unsaturated double bonds can afford a sufficient coating strength even when the proportion thereof in the copolymer is 10% by mol. Thus it is possible to use a comonomer such as 2-hydroxyethyl methacrylate, for improving affinity with the filter substrate, without lowering dyeing properties and coating strength.

Figure 2:
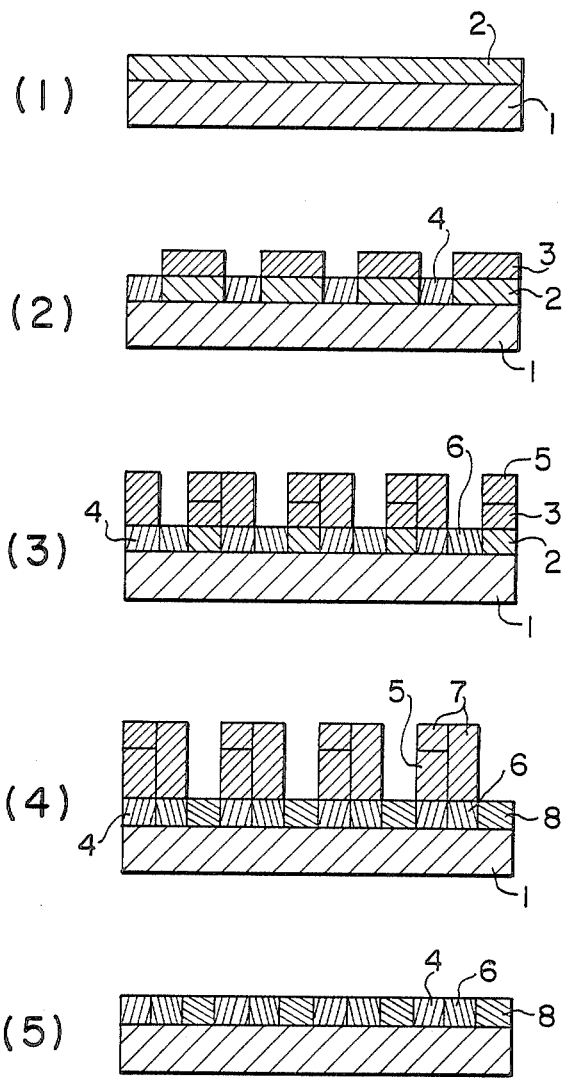
FIG. 2 illustrates the steps of dyeing a coating formed using a photo-setting resin composition of the present invention with a sensitizing solution.

Further, when a color film is prepared using the photo-setting resin composition of the present invention, the resin swell and pigment transfer in the dyeing process are so small as compared with those in the case of conventional materials for forming color filters, that it is possible to form a color filter in a continuous single layer state according to a simple process as shown in FIG. 2, which has so far been difficult (in addition, as to concrete description of the process of FIG. 2, see Example 3 mentioned later).

Main advantages of the photo-setting resin composition of the present invention as a material for fomring color filters are summarized as follows:

(i) The storage stability of the composition is so good that when it is stored in a cold and dark place, it is possible to endure storage over one month or longer.

(ii) The composition contains no hexavalent chromium compound harmful to human body.

(iii) The ethylenic unsaturated double bond of the compound having a photosensitive function is of addition polymerization type; hence it is easy to achieve the balance between the photosensitivity and the dyeing properties.

(iv) Since development in an aqueous solvent is possible, a labor-hygienic danger in the aspect of operational environment occurs scarcely.

(v) Since the composition has good dyeing properties for acid dyes, it is possible to obtain a necessary dyeing concentration in a small coating thickness, in a dye bath at a relatively low temperature and in a short time.

(vi) It is possible to obtain a high resolution to the same extent as that in the case of conventional photosensitive compositions composed mainly of gelatin, glue, etc.

(vii) As compared with conventional photosensitive compositions composed mainly of gelatin, glue, etc., the resin swell and pigment transfer in the resin coating at the time of dyeing process are very small; hence it is possible to form a color filter in a continuous single layer.

Any of the above advantages are matters required for photosensitive resins as a material for color filters, and it is possible to obtain a photosensitive resin provided with these various characteristics according to present invention.

The present invention will be described in more detail, but it should not be construed to be limited thereto.

EXAMPLE 1

| [I] | N—(3-dimethylaminopropyl)methacrylamide | 40 g, |
|---|---|---|
| [II] | 2-(dimethylamino)ethyl methacrylate | 30 g, |
| | mono(2-methacryloyloxyethyl) maleate | 15 g, |
| | 2-hydroxyethyl methacrylate | 15 g, |
| | azobisisobutyronitrile | 0.4 g and |
| | methyl cellosolve | 400 ml, | was placed in a flask equipped with a stirrer, followed by passing nitrogen gas therethrough for one hour, heating it with stirring at 70° C. for 4 hours to carry out polymerization reaction, thereafter introducing the reaction mixture into a large quantity of cyclohexane to deposit the resulting product, removing cyclohexane containing the reaction solvent by decantation and drying the reaction product under reduced pressure to obtain a polymer (85 g).

The $H^1$ NMR spectra (60 MHz) of the polymer were measured. It was confirmed from Table 1 that the polymer contained a unit structure as expressed by the following formula [III]:

TABLE 1

| Attribution | δ(ppm) |
|---|---|
| $\begin{array}{c} CH_3 \\ | \\ -C- \\ | \end{array}$ | 1.0 |
| C—CH$_2$—C | 1.5~2.2 |
| —N(CH$_3$)$_2$ | 2.3 |
| $\overset{\oplus}{N}H(CH_3)\cdots\overset{\ominus}{OC}-$ (with C=O) | 2.5 |
| —NCH$_2$ | 2.6~3.3 |
| —OCH$_2$—CH$_2$O— | 3.5~4.7 |
| —OCCH=CHCO— (both C=O) | 5.5~7.0 |

TABLE 1-continued

| Attribution | δ(ppm) |
|---|---|
| H$_3$C—C(CH$_3$)—CO—CH$_2$—CH$_2$OH (C=O) | |
| H$_3$C—C(CH$_3$)COCH$_2$—CH$_2$N(CH$_3$)$_2$ | |
| H$_3$C—C(CH$_3$)—CNHCH$_2$—CH$_2$—CH$_2$N(CH$_3$)$_2$ | [III] |
| $\overset{\oplus}{N}H(CH_3)_2\ \overset{\ominus}{O}CCH=CHCOCH_2-CH_2OCC-CH_3$ | |

Using the resulting polymer, a sensitizing solution having the following composition was prepared:

| Polymer | 10 g |
|---|---|
| Michler's ketone | 0.3 g |
| Benzyl dimethyl ketal | 0.2 g |
| Methyl cellosolve | 100 ml |

This sensitizing solution was applied onto a glass plate according to spin coating process at 25° C. with 2,000 rpm, followed by drying it at 80° C. for 30 minutes by means of a hot air drier, exposing the coating on the glass plate to U.V. ray of an exposure dose of 3.8 mW/cm$^2$ according to mask exposure process for 40 seconds, developing with purified water at 25° C. for 30 seconds, further subjecting the coating to heat treatment at 165° C. for 30 minutes and dyeing under the following conditions:

(1) Dye bath
  Dye: Aminyl Red E-3BL (tradename of product manufactured by Sumitomo Kagaku Kogyo Co.), one % by weight,
  Solvent: acetic acid aqueous solution (pH 3)
(2) Dyeing temperature: 60° C.
(3) Dyeing time: 3 minutes The coating after dyed had a thickness of 0.7 μm and a clear red pattern was obtained on the glass plate. A coating prepared from a gelatin-bichromic acid system material was dyed under the same conditions and the resulting coating thickness exhibiting the same optical density was sought to give 1.2 μm. Further the resolution obtained under the above conditions was 10 μm.

EXAMPLE 2

The sensitizing solution prepared in Example 1 was stored in a brown color bottle covered by a sunproofing paper at 10° C. for 30 days, followed by exposure, development and dyeing under the same conditions as in Example 1. The optical density in a coating thickness of 0.7 μm was unchanged from that of Example 1 and also the resolution was retained as it was.

EXAMPLE 3

The sensitizing solution used in Example 2 was applied onto a glass substrate according to spin coating process, at 25° C. with 2,000 rpm, followed by drying the resulting coating at 100° C. for 10 minutes, exposing the coating on the glass plate to UV ray of an exposure dose of 3.8 mW/cm$^2$, for 30 seconds, and heat treating at 160° C. for 30 minutes.

The resulting coating was dyed through the steps (1)–(5) shown in FIG. 2.

Step 1: A coating 2 was formed on a glass substrate 1.

Step 2: Onto the coating 2 was applied a positive resist (SR30, a tradename of a product made by Micro Image Technology Company) according to spin coating process, followed by drying at 80° C. for 10 minutes by hot air, to adhere a chrome mask having a mosaic pattern thereonto, exposing it to UV ray of an exposure dose of 3.8 mW/cm$^2$ for 40 seconds, dissolving away the exposed part with a developing solution, to expose a part to be dyed, heat treating at 120° C. for 30 minutes to provide a dyeing-preventive mask 3 and dyeing under the following conditions to obtain a dyed part 4:
 (1) Dye bath:
  Dye: Aminyl Red E-3BL one % by weight,
  Solvent: acetic acid aqueous solution (pH 3)
 (2) Dyeing temperature: 60° C.
 (3) Dyeing time: 5 minutes Step 3: After drying at 100° C. for 10 minutes, a positive resist 5 was applied onto the dyeing-preventive mask 3 and the dyed part 4, followed by carrying out the same operations as those in the case of the first drying, and thereafter dyeing under the following conditions:
 (1) Dye bath:
  Dye: Aminyl green F-3GL (tradename of a product made by Sumitomo Kagaku Kogyo Co.) one % by weight,
  Solvent: acetic acid aqueous solution (pH 3)
 (2) Dyeing temperature: 60° C.
 (3) Dyeing time: 10 minutes Step 4: After drying at 100° C. for 10 minutes, a positive resist 7 was applied onto the resulting dyeing-preventive mask 5 and dyed part 6, followed by carrying out the same operations as those in the cases of the first drying and the second drying and thereafter dyeing under the following conditions:
 (1) Dye bath:
  Dye: Kayation Turcoise p-A (tradename of a product made by Nippon Kayaku Co.) one % by weight,
  Solvent: distilled water
 (2) Dyeing temperature: 60° C.
 (3) Dyeing time: 10 minutes Step 5: After the dyeing and drying at 100° C. for 10 minutes, the dyeing-preventive mask layers 5 and 7 were stripped by means of a stripper, followed by heat treatment at 160° C. for 10 minutes. No color mixing due to color running occurred to give a red, green and blue, clear mosaic color filter having a size of one picture element of 150 μm × 150 μm.

REFERENCE EXAMPLE 1

A sensitizing solution having the following composition was prepared to attempt to make a mosaic filter similar to that of Example 3:

| Gelatin | 20 g |
| Water | 100 ml |
| Ammonium bichromate | 2 g |
| Ethyl alcohol | 6 ml |

The sensitizing solution was applied onto a glass plate according to spin coating process at 40° C. with 2,000 rpm, followed by drying at 100° C. for 10 minutes by means of a hot air drier, exposing the resulting coating on the glass plate to UV ray of an exposure dose of 3.8 mW/cm$^2$ for one minute, and heat treating at 160° C. for 30 minutes.

It was attempted to dye the resulting coating through the steps of Example 3. Namely, a positive photoresist was applied according to spin coating process, followed by exposure, development and heat treatment and thereafter dyeing under the following conditions:
 (1) Dye bath
  Dye: Aminyl Red E-3BL one % by weight
  Solvent: acetic acid aqueous solution (pH 3)
 (2) Dyeing temperature: 60° C.
 (3) Dyeing time: 5 minutes According to Reference example 1, however, a notable color running in the part covered by the dyeing-preventive mask was also observed so that no clear pattern could not be obtained.

EXAMPLE 4

A mixture consisting of

| [I] | Methacryloyloxypropyltrimethyl ammonium chloride | 40 g |
| [II] | Mono(2-methacryloyloxyethyl) maleate | 20 g |
| | 2-Hydroxyethyl methacrylate | 40 g |
| | Azobisisobutyronitrile | 0.4 g |
| | Methyl cellosolve | 400 ml | was placed in a flask equipped with a stirrer, followed by passing nitrogen gas therethrough for one hour, heating it with stirring at 70° C. for 4 hours to carry out polymerization reaction, thereafter introducing the reaction mixture into a large quantity of cyclohexane to deposit the resulting product, removing cyclohexane containing the reaction solvent by decantation and drying the reaction product under reduced pressure to obtain a polymer (70 g).

Using the resulting polymer, a sensitizing solution having the following composition was prepared:

| Polymer | 10 g |
| Michler's ketone | 0.3 g |
| Benzyl dimethyl ketal | 0.2 g |
| p-Methoxyphenol | 0.05 g |
| Methyl cellosolve | 100 ml |

This sensitizing solution was applied onto a glass plate according to spin coating process at 25° C. with 1,500 rpm, followed by drying at 80° C. for 30 minutes by means of a hot air drier, exposing the resulting coating on the glass plate to UV ray of an exposure dose of 3.8 mW/cm$^2$ for 180 seconds according to mask exposure process, thereafter developing with purified water for 30 seconds, further heat treating the coating at 165° C. for 30 minutes and then dyeing under the following conditions:
 (1) Dye bath
  Dye: Aminyl Red E-3BL one % by weight
  Solvent: distilled water (2) Dyeing temperature: 25° C.
(3) Dyeing time: 6 minutes The coating after dyed had a thickness of 0.7 μm and a clear red pattern was obtained. A coating prepared from a gelatin-bichromic acid system material was dyed under the same dyeing conditions and a coating thickness after dyed exhibiting the same optical density was sought to give 1.2 μm. Further, the resolution obtained under the above conditions was 4 μm.

EXAMPLE 5

The sensitizing solution prepared in Example 4 was stored in a brown color bottle covered by a sunproofing paper at 5° C. for 30 days and exposed, developed and dyed under the same conditions as in Example 4. The optical density in a coating thickness of 0.7 μm was unchanged from that in the case of Example 4, and also the resolution was retained.

EXAMPLE 6

The sensitizing solution used in Example 5 was applied onto a glass substrate according to spin coating process at 25° C., with 1,500 rpm, followed by drying the resulting coating at 100° C., for 10 minutes, exposing the coating on the glass plate to UV ray of an exposure dose of 3.8 mW/cm² for 120 seconds, and heat treating at 160° C. for 30 minutes.

The resulting coating was dyed in the same manner as in Example 3 (five steps in FIG. 2) except that the dyeing temperatures at the Step 3 and Step 4 were 25° C., respectively.

REFERENCE EXAMPLE 2

The same sensitizing solution as in Reference example 1 was prepared to attempt to make a mosaic filter similar to that of Example 6 in the same manner as in Reference example 1. A notable color running in the part covered by the dyeing-preventive mask was also observed so that no clear pattern could not be obtained.

What we claim is:

1. A photo-setting resin composition which is soluble in water or polar solvents other than water obtained by copolymerizing as effective components, a monomer expressed by the formula

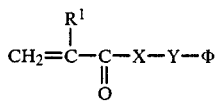

wherein $R^1$ represents H, $CH_3$ or $C_2H_5$; X represents —O— or —NH—; Y represents a linear chain or branched hydrocarbon group of 1 to 4 carbon atoms; Φ represents

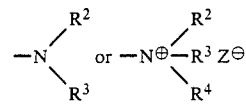

wherein $R^2$, $R^3$ and $R^4$ each represent an alkyl group of 1 to 4 carbon atoms and $Z^\ominus$ represents an anion, with 5 to 80 mole % of a monomer expressed by the formula

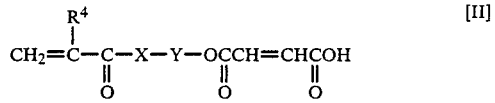

wherein $R^4$ represents H, $CH_3$ or $C_2H_5$ and X and Y each are as defined above.

2. A photo-setting resin composition according to claim 1 wherein said monomer expressed by the formula [II] is at least one member selected from the group consisting of

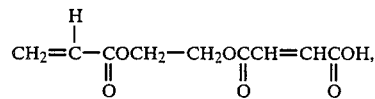

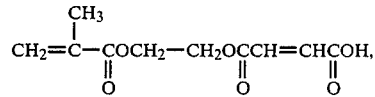

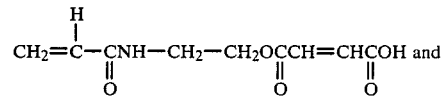

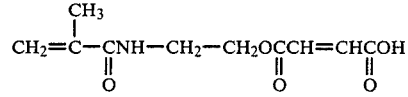

3. A -photo-setting resin composition according to claim 1 wherein the proportion of said monomer expressed by the formula [I] in said composition is in the range of 20 to 80% by mol based on the total quantity of said monomer of the formula [I] and said monomer of the formula [II].

4. A photo-setting resin composition according to claim 1, obtained by copolymerizing said monomer of the formula [I] and said monomer of the formula [II] further with less than 50% by weight based on the total weight of the total monomers of at least one monomer selected from the group consisting of acrylic acid, methacrylic acid, acrylic acid esters and methacrylic acid esters.

* * * * *